United States Patent [19]
Kubota et al.

[11] Patent Number: 5,821,611
[45] Date of Patent: Oct. 13, 1998

[54] SEMICONDUCTOR DEVICE AND PROCESS AND LEADFRAME FOR MAKING THE SAME

[75] Inventors: Hitoshi Kubota; Masao Yamamoto; Komei Sudo; Daisuke Kitawaki; Takayuki Hamasaki; Masayoshi Akiyama; Hironobu Kawauchi; Masaru Nagano; Hiroshi Imai; Mitsunori Baba; Masaru Shoji; Hiroshi Tomochika, all of Kyoto, Japan

[73] Assignee: Rohm Co. Ltd., Kyoto, Japan

[21] Appl. No.: 554,597

[22] Filed: Nov. 6, 1995

[30] Foreign Application Priority Data

| Nov. 7, 1994 | [JP] | Japan | 6-272147 |
| Nov. 7, 1994 | [JP] | Japan | 6-272148 |
| Nov. 7, 1994 | [JP] | Japan | 6-272150 |
| Nov. 7, 1994 | [JP] | Japan | 6-272151 |
| Nov. 24, 1994 | [JP] | Japan | 6-289664 |
| Nov. 30, 1994 | [JP] | Japan | 6-297648 |
| Dec. 28, 1994 | [JP] | Japan | 6-327321 |

[51] Int. Cl.$^6$ .................................................. H01L 23/495
[52] U.S. Cl. .................. 257/673; 257/676; 257/666; 257/735
[58] Field of Search ............................ 257/673, 666, 257/676, 735, 775

[56] References Cited

U.S. PATENT DOCUMENTS

| 3,348,105 | 10/1967 | Doyle | 257/782 |
| 4,189,342 | 2/1980 | Kock | 257/735 |
| 4,616,250 | 10/1986 | Folk . | |
| 4,935,803 | 6/1990 | Kalfus et al. | 257/673 |
| 5,038,453 | 8/1991 | Kurita et al. . | |
| 5,218,231 | 6/1993 | Kudo | 257/735 |

FOREIGN PATENT DOCUMENTS

| 4838070 | 9/1971 | Japan . |
| 63-8618 | 2/1988 | Japan . |
| 5121615 | 5/1993 | Japan . |

*Primary Examiner*—Mahshid D. Saadat
*Assistant Examiner*—S. V. Clark
*Attorney, Agent, or Firm*—Michael D. Bednarek; Kilpatrick Stockton LLP

[57] ABSTRACT

A semiconductor device which comprises a first lead having a tip formed with an island, a semiconductor chip unit mounted on the island of the first lead by means of a solder layer and having a plurality of electrode bumps projecting away from the island, and a plurality of additional leads each of which has a tip electrically connected to the electrode bumps via respective solder deposits. The additional leads include at least second and third leads. The tips of the second and third leads are at least partially wider than the semiconductor chip.

30 Claims, 19 Drawing Sheets

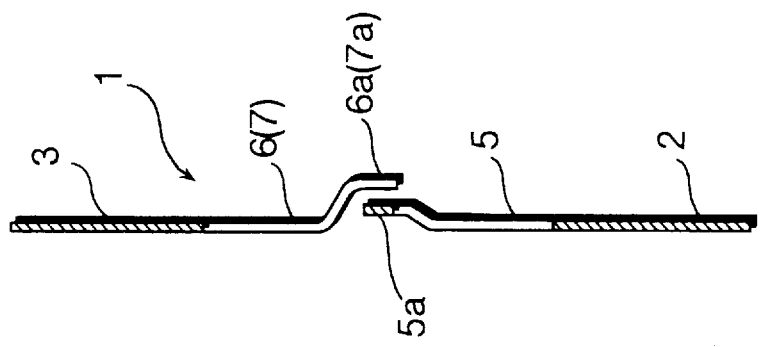
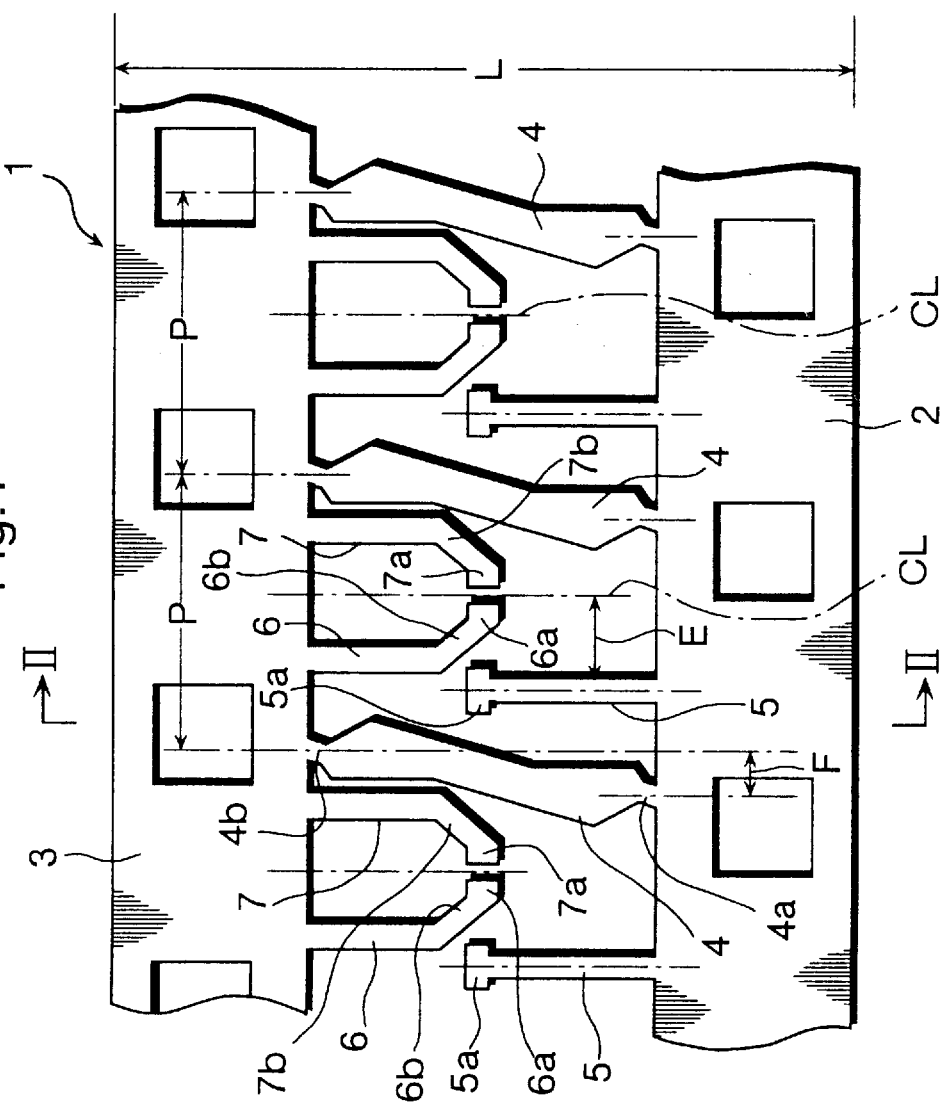

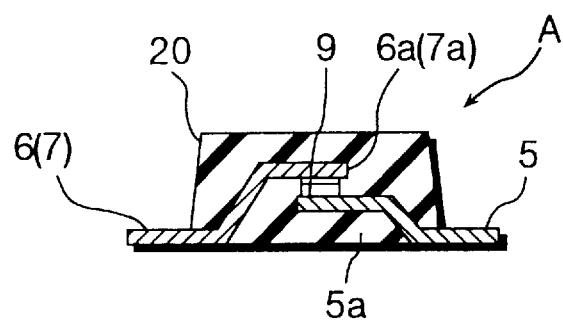
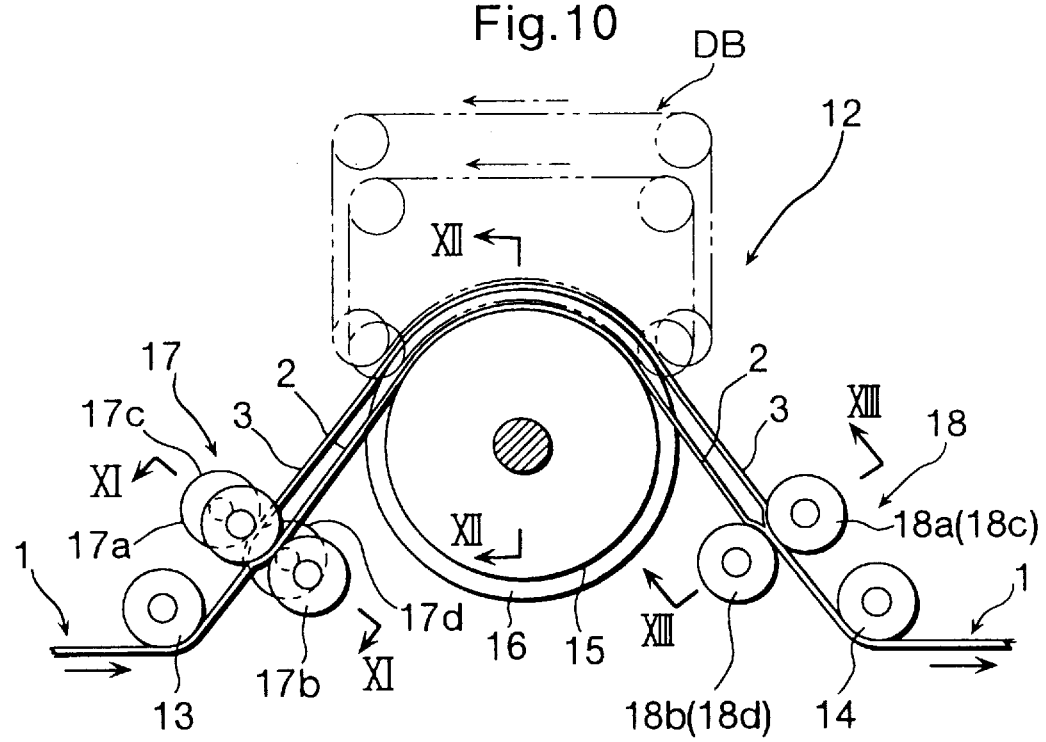

SEMICONDUCTOR DEVICE AND PROCESS AND LEADFRAME FOR MAKING THE SAME

BACKGROUND OF THE INVENTION

1. Field of the Invention

This invention relates to a semiconductor device of the type which has three or more leads for a semiconductor chip unit. The present invention also relates to a process and a leadframe for advantageously making such a semiconductor device.

The term semiconductor chip unit as used herein refers to a single semiconductor chip such as a transistor chip which itself has three poles as well as a group of semiconductor chips such as a group of diode chips to be incorporated in a single device to provide more than two poles.

2. Description of the Related Art

A transistor as an example of multi-lead semiconductor device includes a transistor chip which has three poles. One pole Is electrically connected to a first lead which has an enlarged tip to work as an island for mounting a semiconductor chip. The other two poles or electrodes are electrically connected, respectively, to second and third leads by wire bonding. The transistor chip together with part of the first to third leads is usually enclosed in a molded resin package for protection.

According to the arrangement described above, since the second and third leads are electrically connected to the two electrodes of the chip by wire bonding the production cost inevitably increases due to the need for wire bonding. Further, the bondwires, which are generally very thin, are liable to break upon passage of a large current, the prior art semiconductor device cannot be used in applications which require a large current.

To overcome the above-described problems, Japanese Patent Application Laid-open No. 48-38070 (Laid-open: Jun. 5, 1973) discloses a semiconductor device wherein a semiconductor chip bonded on an enlarged tip island of a first lead has two electrodes which are electrically connected to second and third leads by soldering (wireless bonding). Japanese Patent Publication No. 63-8618 (Published: Feb. 23, 1988) also discloses a similar wireless bonding for a semiconductor device.

However, according to the prior art arrangement disclosed in either of the Japanese documents, the tips of the second and third leads used for soldering are only as wide as the electrodes of the semiconductor chip. Thus, if the semiconductor chip is improperly positioned on the island of the first lead, the second and third leads comes out of position relative to the electrodes of the chip and therefore cannot be properly soldered to the electrodes. For this reason, the semiconductor chip need be accurately mounted on the island, which results in a production cost increase.

SUMMARY OF THE INVENTION

It is, therefore, an object of the present invention to provide a semiconductor device which can overcome the above-described problems.

Another object of the present invention is to provide an improved process for making such a semiconductor device.

A further object of the present invention is to provide a leadframe which can be advantageously used in making a semiconductor device.

According to one aspect of the present invention, there is provided a semiconductor device comprising:

a first lead having a tip formed with an island;

a semiconductor chip unit mounted on the island of the first lead by means of a solder layer, the chip unit including at least one semiconductor chip and having a plurality of electrode bumps projecting away from the island; and a plurality of additional leads each of which has a tip electrically connected to the electrode bumps via respective solder deposits, the additional leads including at least second and third leads;

wherein the tips of the second and third leads are at least partially wider than the semiconductor chip.

The tips of the second and third leads may be bent toward the electrode bumps. Further, each of the solder deposits for the second and third leads may be formed on a corresponding one of the electrode bumps with an outward offset. Moreover, the additional leads further may include a fourth lead between the second and third leads.

The semiconductor chip unit may comprises only a single semiconductor chip which has a plurality of electrode bumps. Alternatively, the semiconductor chip unit may comprise a plurality of semiconductor chips each having a single electrode bump.

The tips of the second and third leads may extend toward each other perpendicularly to the first lead. In this case, the tips of the second and third leads may be followed by respective oblique portions.

Alternatively, the tips of the second and third leads may extend obliquely toward each other in a plane parallel to the island.

In a preferred embodiment of the present invention, the tips of the second and third leads are inclined in a plane perpendicular to the island.

In another preferred embodiment, each of the tips of the second and third leads is formed with a recess for engaging a corresponding one of the bumps. The recess may be replaced by an opening or a cutout.

In a further preferred embodiment, the island is formed with a mounting recess for receiving the semiconductor chip together with the solder layer.

In still another preferred embodiment, each of the tips of the second and third leads is formed with a non-solvable member for preventing the solder deposits from merging with each other.

Alternatively or additionally, each of the tips of the second and third leads is formed with a cutting burr for the same purpose.

In a modified embodiment, an insulating non-soldable member is interposed between the tips of the second and third leads for preventing the solder deposits from merging with each other while electrically separating between the second and third leads.

In a further preferred embodiment, the island is formed with a groove closely surrounding the semiconductor chip, the solder layer entering into the groove.

According to another aspect of the present-invention, there is provided a process for making semiconductor devices by using a leadframe, the leadframe comprising a plurality of first leads each having a tip formed with an island, and plural groups of additional leads each having a tip; the process comprising the steps of:

applying a solder paste layer on the island of each first lead;

bonding a semiconductor chip unit on the island of said each first lead by means of the solder paste layer, the chip unit including at least one semiconductor chip and having a plurality of electrode bumps projecting away from the island in corresponding relation to the additional leads in each group;

interposing a solder deposit between each electrode bump and a corresponding lead; and heating the leadframe to a temperature above the melting point of solder.

According to a further aspect of the present invention, there is provided a leadframe comprising:

a first hide band formed with a plurality of first leads arranged at a predetermined pitch longitudinally of the leadframe, each of the first leads having an island;

a second side band formed with plural groups of additional leads arranged in corresponding relation to the first leads, each group of additional leads providing a center line which deviates from a corresponding first lead longitudinally of the leadframe by a first dimension; and a plurality of section bars each having a first connecting portion for connection to the first side band and a second connecting portion for connection to the second side band;

wherein the first and second connecting portions of each section bar deviates from each other longitudinally of the leadframe by a second dimension which is substantially half the first dimension.

Other objects, features and advantages of the present invention will be fully understood from the following detailed description given with reference to the accompanying drawings.

BRIEF DESCRIPTION OF THE DRAWINGS

In the accompanying drawings:

FIG. 1 is a plan view showing a leadframe used for making a semiconductor device according to a first embodiment of the present invention;

FIG. 2 is a sectional view taken on lines II—II in FIG. 1;

FIG. 9 is a sectional view taken on lines IX—IX in FIG. 8;

FIG. 10 is a front view showing a differential overlapping mechanism used for making the semiconductor device according to the present invention;

DETAILED DESCRIPTION OF THE PREFERRED EMBODIMENTS

Figure 3:
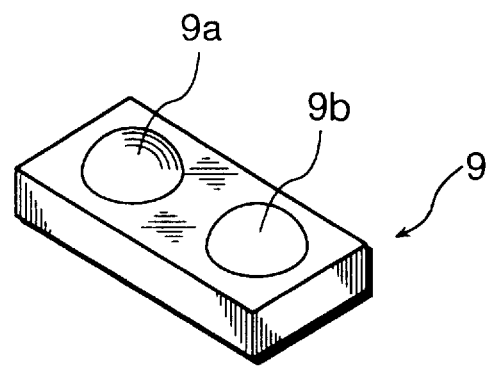
FIG. 3 is a perspective view showing a semiconductor chip used for making -he device of the first embodiment.

Throughout the accompanying drawings, like parts are designated by the same reference numerals.

FIGS. 1 through 9 illustrate the successive steps of making semiconductor devices according to a first embodiment of the present invention. In this embodiment, each of the semiconductor devices is a triple-terminal device which has three leads.

In a first step, a band-like leadframe 1 is prepared by punching a metal sheet, as shown in FIGS. 1 and 2. The leadframe 1 has two parallel side bands 2, 3 integrally connected together by a plurality of section bars 4 which are spaced at a constant pitch P along the leadframe 1.

The side band 2 is integrally formed with a first lead 5 between each two adjacent section bars 4. The first lead 5 extends toward the other side band 3 and has an island 5a.

The other side band 3 is integrally formed with a second and a third leads 6, 7 extending toward the counterpart side band 2 between each two adjacent section bars 4. The second and third leads 6, 7 have respective tips 6a, 7a extending toward each other. Further, the second and third leads 6, 7 have respective oblique portions 6b, 7b extending in a flaring manner. As clearly appreciated in FIG. 1, a transverse center line CL between the second and third leads 6, 7 is displaced from the corresponding first lead 5 by a predetermined distance E longitudinally of the leadframe 1.

Each of the section bars 4 have connecting neck portions 4a, 4b at both ends for connection to the respective side bands 2, 3. The section bar 4 is suitably inclined. The inclination of the section bar 4 is set such that both connecting neck portions 4a of the same section deviates from each other longitudinally of the leadframe 1 by an amount F which is half of the above-mentioned distance E (hence, F=E/2).

Figure 4:
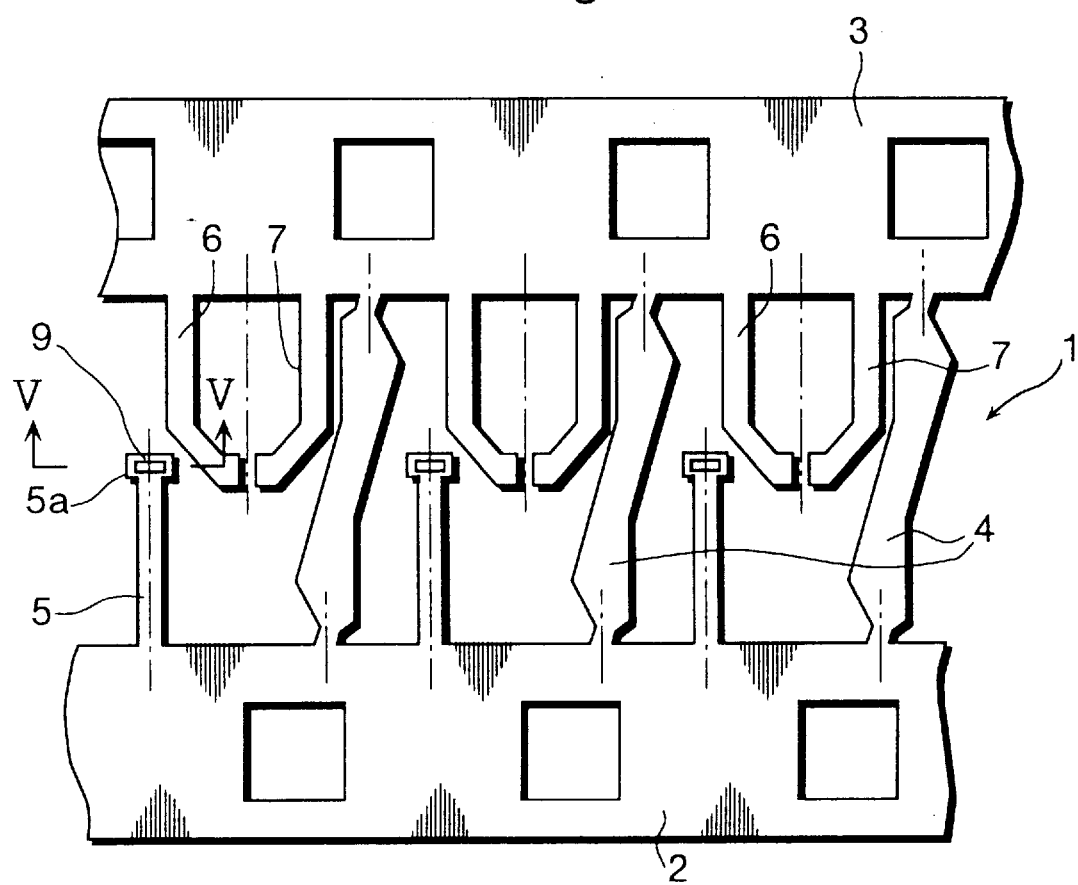
FIG. 4 is a plan view showing the same leadframe after mounting the chip illustrated in FIG. 3.

In a second process step, a solder paste layer 8 (see FIG. 5) is formed on the island 5a of each first lead 5 during longitudinal transfer of the leadframe 1, and a semiconductor chip 9 is bonded on the island 5a, as shown in FIG. 4. The semiconductor chip 9 has two electrode bumps 9a, 9b, as shown in FIG. 3.

Figure 5:
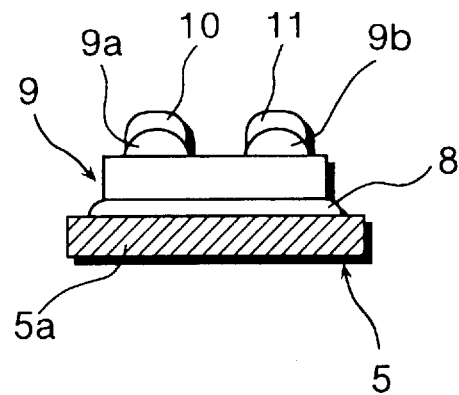
FIG. 5 is a sectional view taken on lines V—V in FIG. 4.

Then, as shown in FIG. 5, solder paste deposits 10, 11 are applied on the respective bumps 9a, 9b of the semiconductor chip 9. Instead, such solder paste deposits may be applied on the respective tips 6a, 7a of the second and third leads 6, 7.

Figure 6:
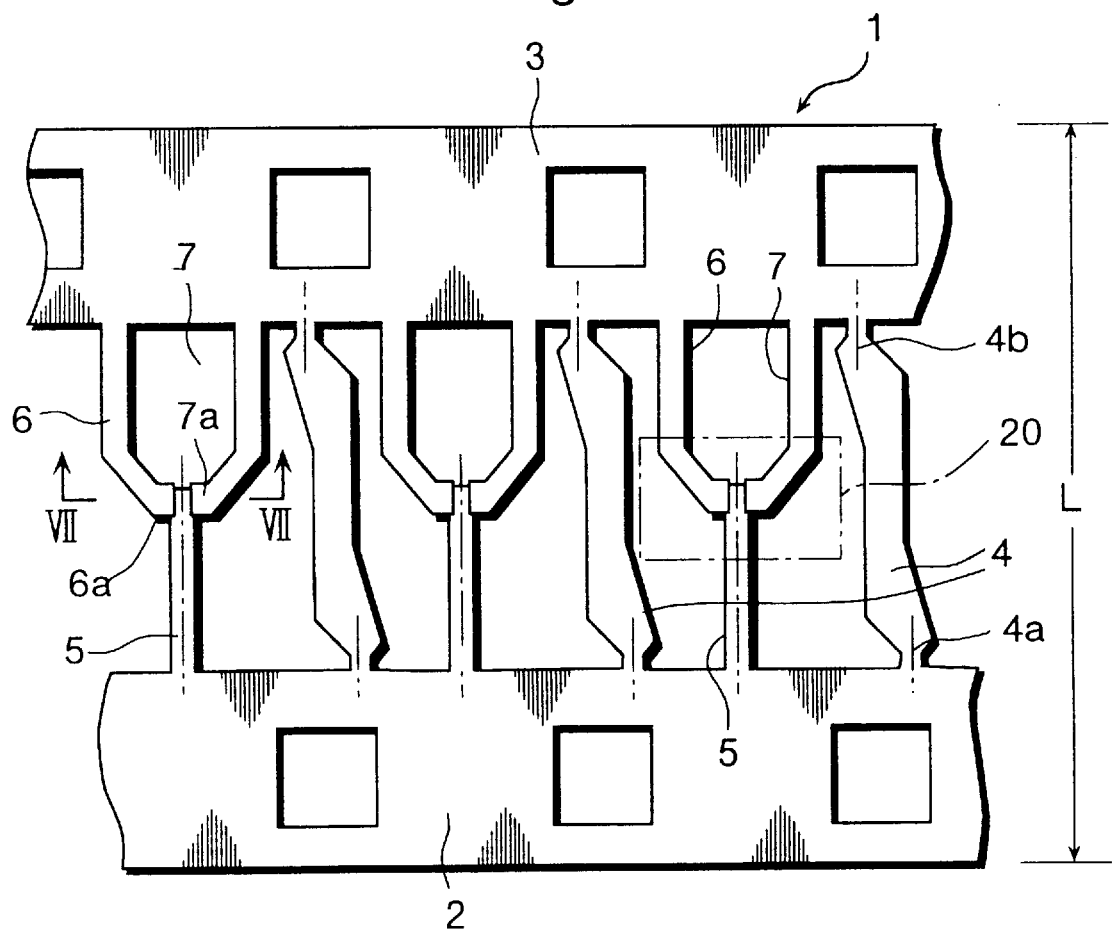
FIG. 6 is a plan view showing the same lead frame after longitudinal deformation thereof.

Then, as shown in FIG. 6, the side bands 2, 3 of the leadframe 1 are displaced relative to each other in such a manner that the respective tips 6a, 7a of the second and third leads 6, 7 come into contact with the solder paste deposits 10, 11 at the electrode bumps (see also FIG. 5). Relative displacement of the side bands 2, 3 may be preferably performed by a differential overlapping mechanism which is described hereinafter.

Figure 7:
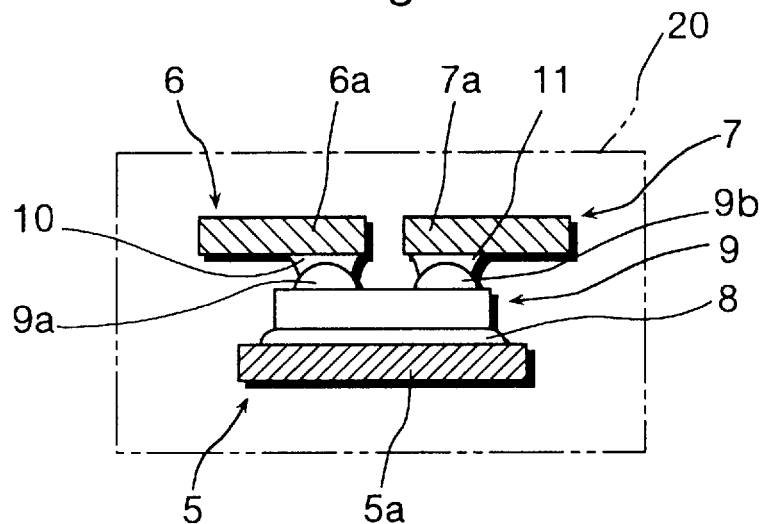
FIG. 7 is a sectional view taken on lines VII—VII in FIG. 6.

Then, the leadframe 1 is brought into a heating furnace (not shown) for heating to a temperature above the melting point of the applied solder. As a result, the solder layer 8 the island 5a and the semiconductor chip 9 melts to partially alloy with the island 5a and the chip 9 for bonding thereto. Similarly, each of the solder deposits 10, 11 melts to partially alloy with a corresponding one of the electrode bumps 9a, 9b and a corresponding one of the second and third lead tips 6a, 7a. Such a bonded condition is shown in FIG. 7.

Figure 8:
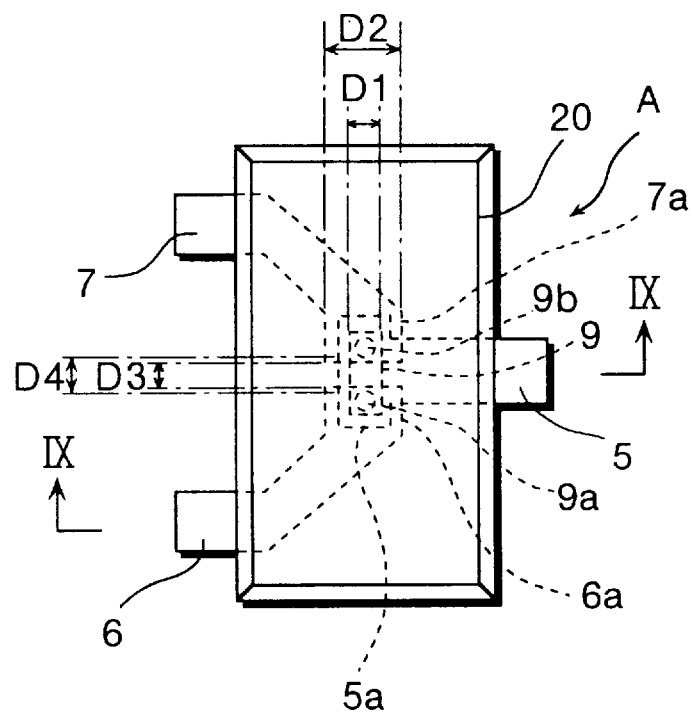
FIG. 8 is a plan view showing the semiconductor device of the first embodiment.

Then, as shown in FIGS. 8 and 9, a resin package 20 is molded to enclose the semiconductor chip 9 together with part of the first to third leads 5–7. The package 20 may be typically made of a thermosetting resin such as epoxy. It should be appreciated that the resin package 20 is also shown in phantom in FIGS. 6 and 7.

Finally, the first to third leads 5–7 are cut off from the leadframe 1 to provide a product triple-terminal semiconductor device A, as also shown in FIGS. 8 and 9.

According to the process described above, the solder layer 8 and the solder deposits 10, 11 (see FIG. 7) melt when the leadframe 1 is heated in the unillustrated heating furnace. In this condition, the semiconductor chip 9 placed on the melted solder layer 8 is brought into a floating state, whereas the melted solder deposits 10, 11 tending to form into a ball apply surface tension to the respective electrode bumps 9a, 9b. As a result, the semiconductor chip 9 is automatically adjusted in position by the surface tension applied by the melted solder deposits 10, 11 which later solidify to positionally fix the chip 9. In other words, even if the chip 9 is initially positioned with a slight deviation, such a positional deviation is later corrected when the leadframe 1 is heated to a temperature above the melting point of the solder.

The differential overlapping mechanism used for suitably displacing the side bands 2, 3 of the leadframe 1 relative to each other is illustrated in FIGS. 10 through 13. The differential overlapping mechanism generally designated by reference 12 comprises a first guide roller 13 and a second guide roller 14 for guiding the leadframe 1 longitudinally thereof. The overlapping mechanism 12 also comprises a diametrically smaller feed wheel 15 held in feeding contact with one side band 2 of the leadframe 1, and a diametrically larger feed wheel 16 in feeding contact with the other side band 3 of the leadframe 1.

Since both feed wheels 15, 16 are arranged concentrically, the respective side bands 2, 3 contact these wheels through an equal angle θ. However, due to the diametrical difference, the first feed wheel 15 provides a shorter contact length for the side band 2 than the second feed wheel 16 does for the other side band 3. Therefore, the first and second feed wheels 15, 16 may be rotated to have an equal circumferential speed for causing relative longitudinal displacement between the two side bands 2, 3 of the leadframe 1. Such rotation of the two feed wheels 15, 16 may be provided by a drive belt device DB.

Figure 11:
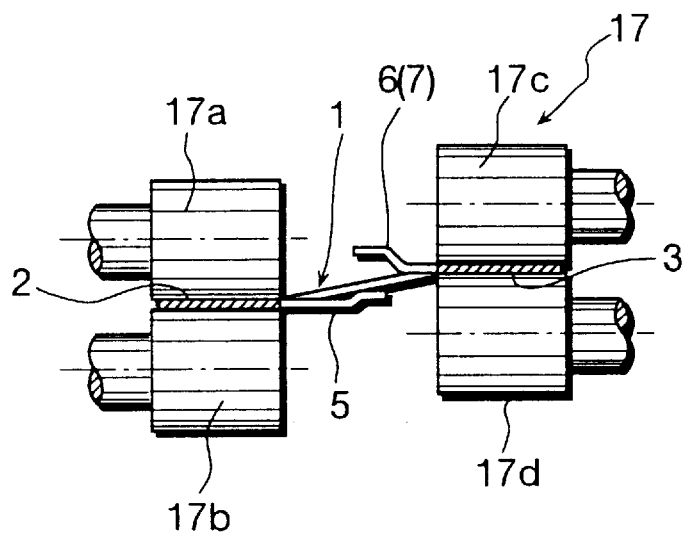
FIG. 11 is a sectional view taken along lines XI—XI in FIG. 10.
Figure 12:
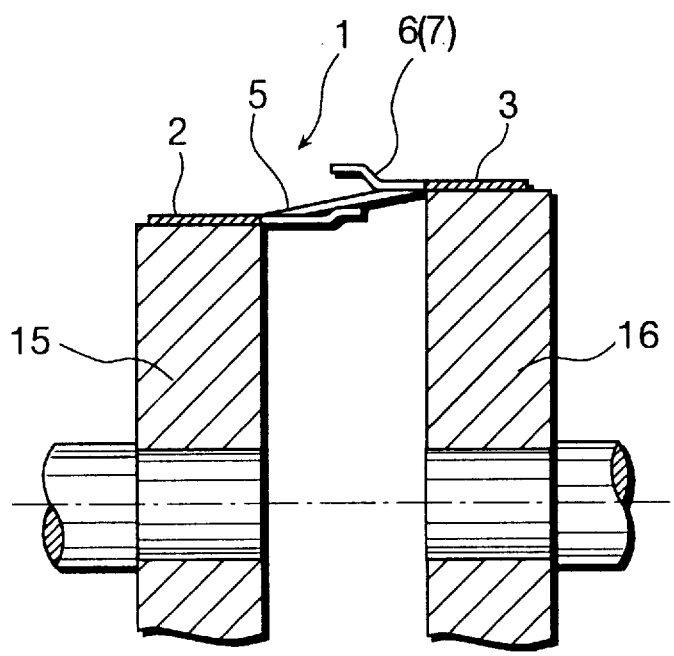
FIG. 12 is a sectional view taken along lines XII—XII in FIG. 10.

A vertically separating mechanism 17 is arranged between the first guide roller 13 and the pair of feed wheels 15, 16. As shown in FIGS. 10 and 11, the separating mechanism 17 includes a first pair of opposite rollers 17a, 17b for displacing the side band 2 of the leadframe 1 downward, and a second pair of opposite rollers 17c, 17d for displacing the other side band 3 upward. Thus, the two side bands 2, 3 are vertically separated away from each other as the leadframe 1 passes through the vertically separating mechanism 17.

Figure 13:
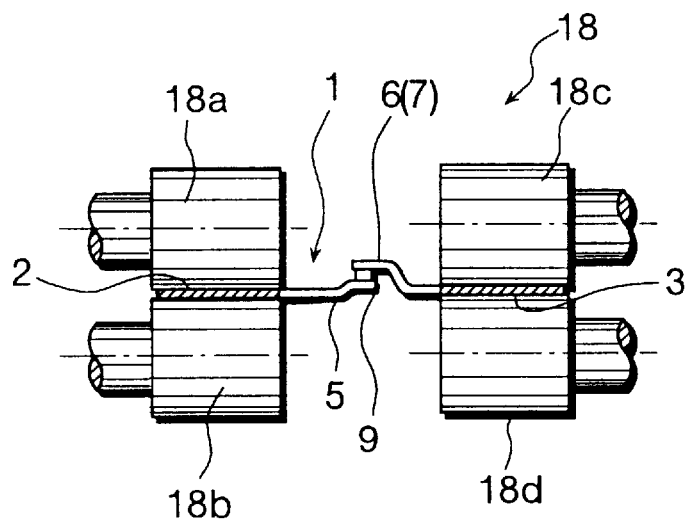
FIG. 13 is a sectional view taken along lines XIII—XIII in FIG. 10.

A vertically returning mechanism 18 is arranged between the second guide roller 14 and the pair of feed wheels 15, 16. As shown in FIGS. 10 and 13, the returning mechanism 18 includes a first pair of opposite rollers 18a, 18b for displacing the side band 2 of the leadframe 1 upward, and a second pair of opposite rollers 18c, 18d for displacing the other side band 3 downward.

Thus, the two side bands 2, 3 are vertically returned toward each other as the leadframe 1 passes through the vertically returning mechanism 18.

The differential overlapping mechanism 12 operates in the following manner.

First, when the leadframe 1 passes through the vertically separating mechanism 17, the two side bands 2, 3 of the leadframe 1 are vertically separated away from each other.

Then, when the leadframe 1 passes along the feed wheels 15, 16, the side band 2 moves through the contact angle θ in a shorter time than the other side band 3 because the two feed wheels 15, 16 are diametrically different but rotated to have the same circumferential speed. As a result, each first lead 5 carried by the side band 2 catches up the corresponding pair of second and third leads 6, 7 by an amount corresponding to the initial distance E (see FIG. 1) between the first lead 5 and the center line CL.

Finally, when the leadframe 1 passes through the vertically returning mechanism 18, the two side bands 2, 3 are vertically displaced toward each other. As a result, the semiconductor chip 9 is sandwiched between the first lead 5 and each of the second and third leads 6, 7, as shown in FIGS. 7 and 13.

As previously described, each of the section bars 4 is inclined so that both connecting neck portions 4a of the same section deviates from each other longitudinally of the leadframe 1 by an amount F which is half of the above-mentioned distance E. Thus, after passing through the differential overlapping mechanism 12, the section bar 4 is oppositely inclined with the same angle of inclination, as appreciated by comparing FIGS. 1 and 6. As a result, the leadframe 1 does not change in width L before and after it passes the differential overlapping mechanism 12, thereby eliminating the need for adjusting the transfer mechanism after the leadframe 1 passes through the differential overlapping mechanism 12.

Returning to FIG. 8, each of the tips 6a, 7a of the second and third leads 6, 7 preferably has a width D2 which is larger than the width D1 of the semiconductor chip 9. Such dimensional setting is advantageous in that the tips 6a, 7a of the second and third leads 6, 7 can be brought into proper electrical conduction with the respective electrode bumps 9a, 9b even if these tips 6, 7 positionally deviates widthwise of the semiconductor chip 9.

Further, the spacing D3 between the respective tips 6a, 7a of the second and third leads 6, 7 should be not less than 0.05 mm, preferably not less than 0.08 mm and particularly not less than 0.1 mm. Similarly, the spacing between the respective electrode bumps 9a, 9b should be not less than 0.04 mm, preferably not less than 0.1 mm and particularly not less than 0.14 mm.

Figure 14:
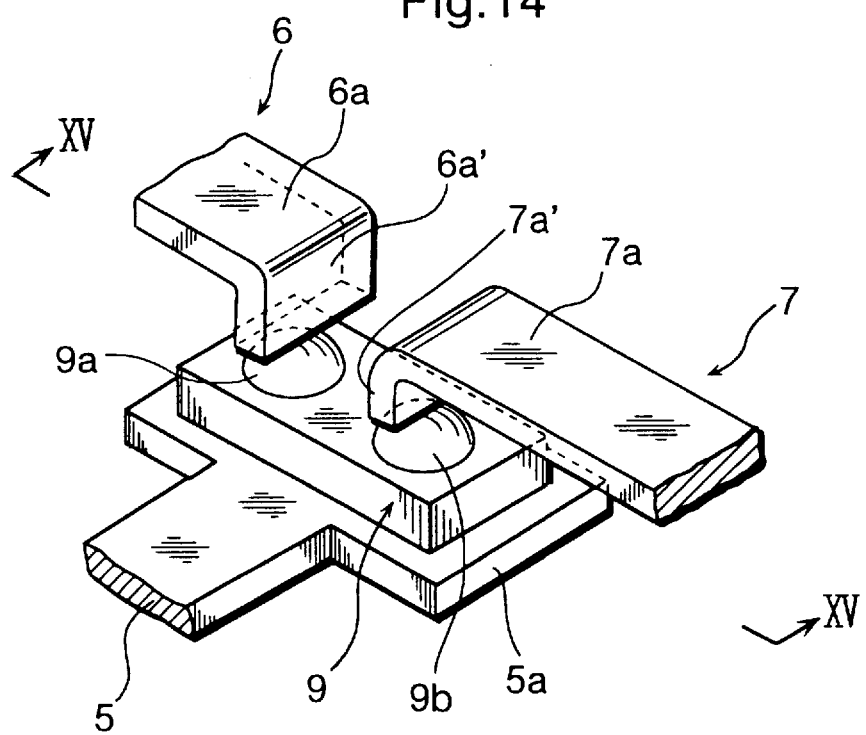
FIG. 14 is a perspective view showing a principal portion a semiconductor device according to second embodiment of the present invention.
Figure 15:
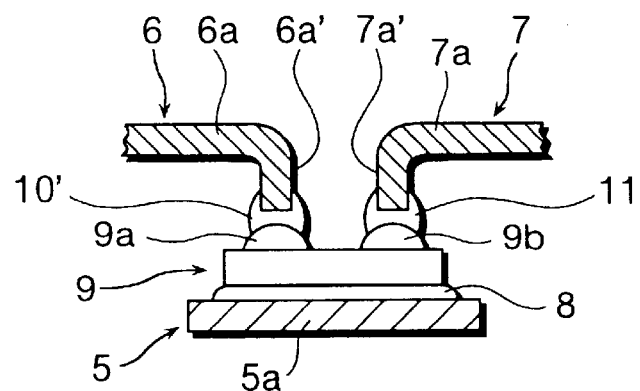
FIG. 15 is a sectional view taken along lines XV—XV in FIG. 14.

FIGS. 14 and 15 show a second embodiment of the present invention wherein the tips 6a, 7a of the second and third leads 6, 7 are made to have respective bent portions 6a', 7a' directed toward the respective electrode bumps 9a, 9b of the semiconductor chip 9. According to this embodiment, the solder deposits 10, 11 will have a stronger tendency to form into a ball when melted, so that they will provide an improved positional correction for the chip 9 due to an increased surface tension.

Figure 16:
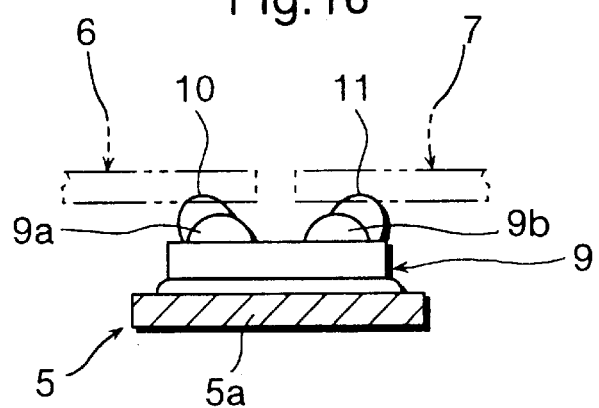
FIG. 16 is a front view, partly in section, showing a principal portion of a semiconductor device according to a third embodiment of the present invention.

FIG. 16 shows a third embodiment of the present invention wherein the solder deposits 10, 11 are formed offset toward both ends of the semiconductor chip 9 (or away from each other)

According to this arrangement, it is possible to prevent the solder deposits 10, 11 from merging with each other in a bridge-like fashion when melted, thereby decreasing the likelihood of producing a rejectable product.

Figure 17:
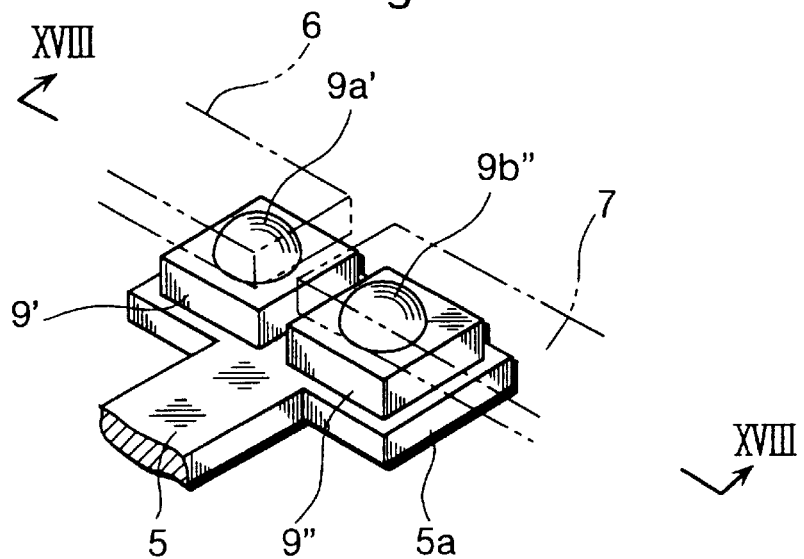
FIG. 17 is a perspective view showing a principal portion of a semiconductor device according to a fourth embodiment of the present invention.
Figure 18:
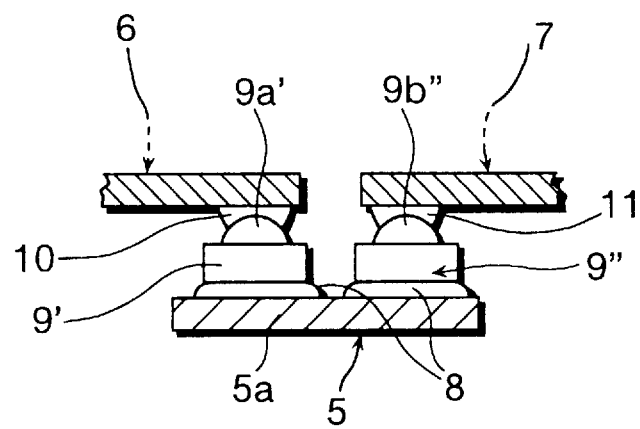
FIG. 18 is a sectional view taken along lines XVIII—XVIII in FIG. 17.

FIGS. 17 and 18 show a fourth embodiment wherein two semiconductor chips 9', 9" each having an electrode bump 9a', 9" are mounted on the island 5a of the first lead 5. According to this arrangement, it is possible to incorporate two different semiconductor chips (having different characteristics) in a single semiconductor device.

Figure 19:
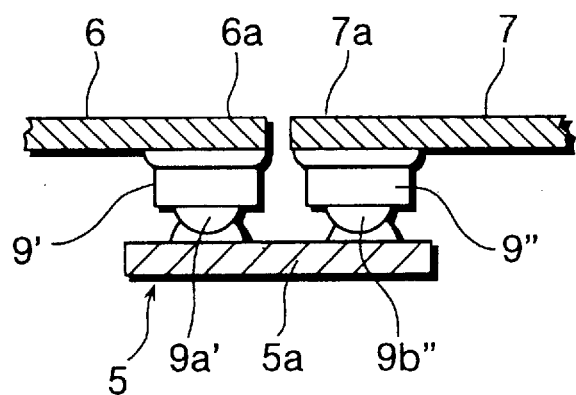
FIG. 19 is a sectional view similar to FIG. 18 but showing a semiconductor device according to a fifth embodiment of the present invention.

FIG. 19 shows a fifth embodiment of the present invention which is similar to the fourth embodiment of FIGS. 17 and 18 but differs therefrom in that each of the semiconductor chips 9', 9" are arranged in an inverted posture. Specifically, each chip is mounted on the island 5a of the first lead 5 with its electrode bump 9a', 9b' directed to the island 5a.

Figure 19A:
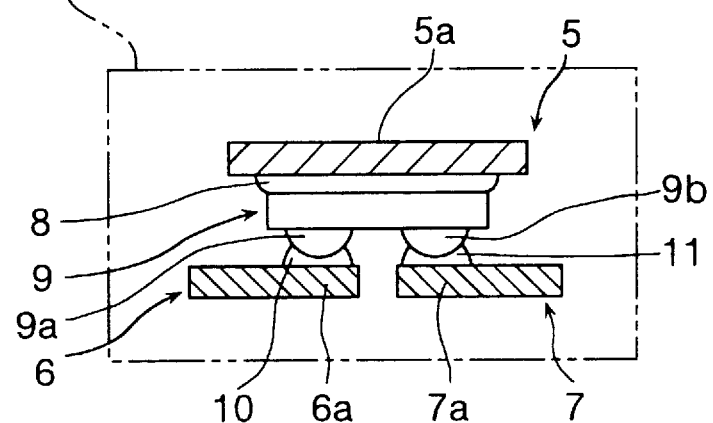
FIG. 19A is a sectional view similar to FIG. 18 but showing a semiconductor device according to a sixth embodiment of the present invention.
Figure 20:
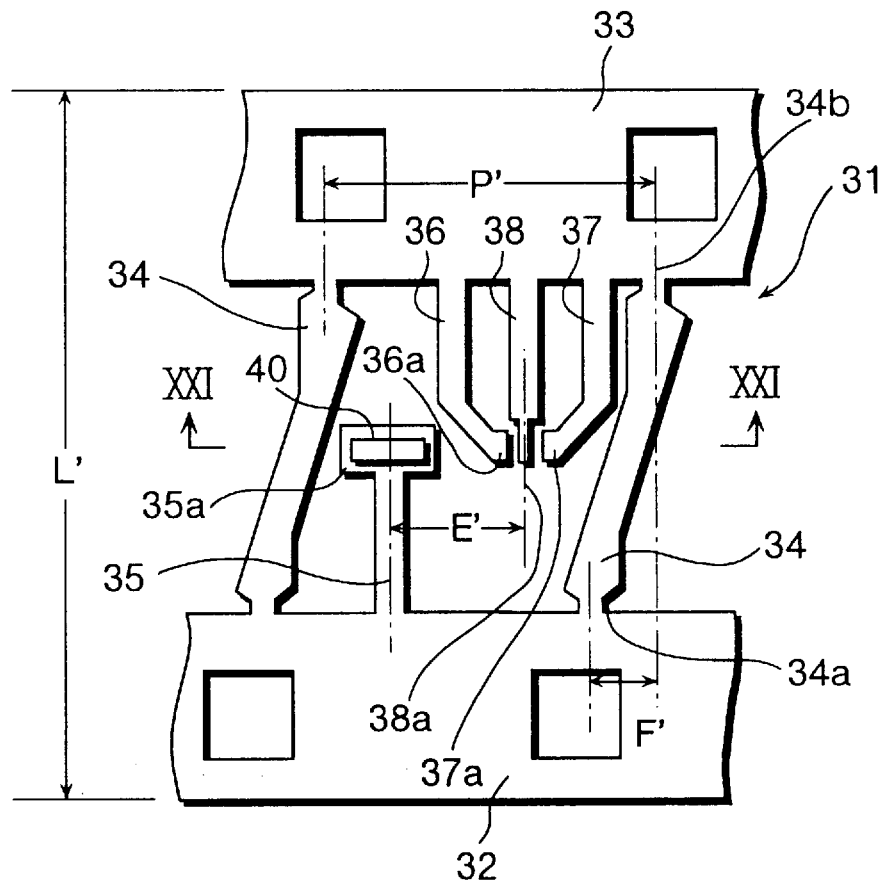
FIG. 20 is a plan view showing a leadframe used for making semiconductor device according to a seventh embodiment of the present invention.
Figure 21:
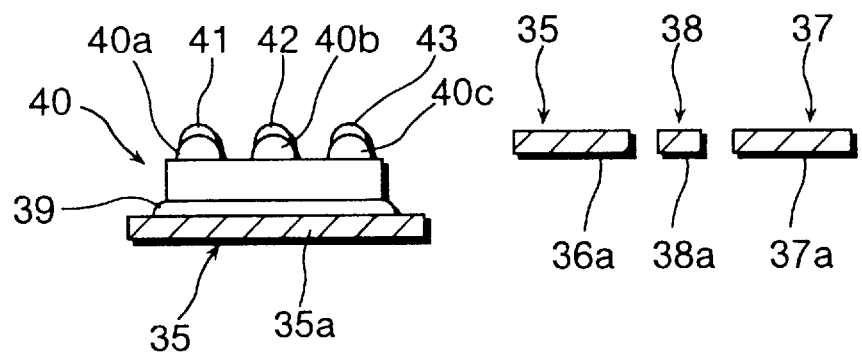
FIG. 21 is a sectional view taken along lines XXI—XXI in FIG. 20.

FIG. 19A shows a sixth embodiment of the present invention which is similar to the first embodiment shown in FIGS. 1 through 9 but differs therefrom in that all elements are arranged in an inverted posture. Specifically, the second and third leads 6, 7 are disposed below the first lead 5, and the semiconductor chip 9 is mounted on the second and third leads 6, 7 with the electrode bumps 9a, 9b directed downward.

FIGS. 20 through 23 show a seventh embodiment wherein each semiconductor device is made to have four leads by using a modified leadframe 31. Like the leadframe of the first embodiment (see FIG. 1), the modified leadframe 31 has two parallel side bands 32, 33 integrally connected together by a plurality of section bars 34 which are spaced at a constant pitch P' along the leadframe 1.

The side band 32 is integrally formed with a first lead 35 between each two adjacent section bars 34. The first lead 35 extends toward the other side band 33 and has an island 35a.

The other side band 33 is integrally formed with a second and a third leads 36, 37 extending toward the counterpart side band 32 between each two adjacent section bars 34. The second and third leads 36, 37 have respective tips 36a, 37a extending toward each other. Further, the second and third leads 36, 37 have respective inclined portions 36b, 37b extending in a flaring manner. In addition, the side band 33 is also formed integrally with a third fourth lead 38 extending toward the counterpart side band 32 to have a tip 38a between the second and third leads 36, 37. The fourth lead 38 is displaced from the corresponding first lead 35 by a predetermined distance E' longitudinally of the leadframe 1.

Each of the section bars 34 have connecting neck portions 34a, 34b at both ends for connection to the respective side bands 32, 33. The section bar 34 is suitably inclined. The inclination of the section bar 34 is set such that both connecting neck portions 34a of the same section deviates from each other longitudinally of the leadframe 31 by an amount F' which is half of the above-mentioned distance E' (hence, F'=E'/2).

For mounting a semiconductor chip 40, a solder paste layer 39 (see FIG. 21) is formed on the island 35a of each first lead 35 during longitudinal transfer of the leadframe 31. The semiconductor chip 40 has three electrode bumps 40a, 40b, 40c.

Then, for establishing electrical connection to the second to fourth leads 36–38, solder paste deposits 41, 42, 43 are applied on the respective bumps 40a–40c of the semiconductor chip 40. Instead, such solder paste deposits may be applied on the respective tips 36a–38c of the second to fourth leads 36–38.

Figure 22:
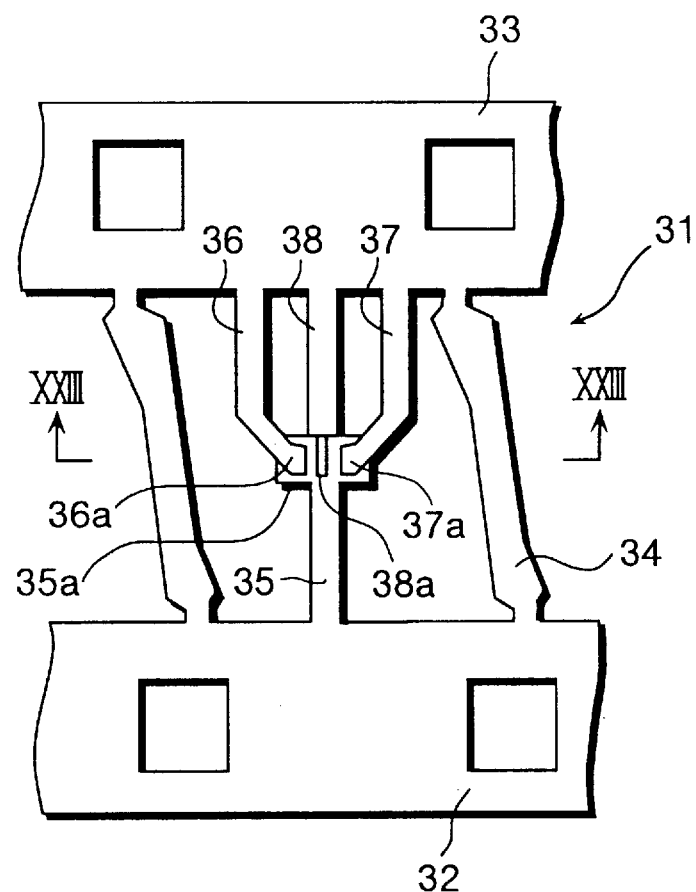
FIG. 22 is a plan view showing the leadframe of FIG. 20 after longitudinal deformation thereof.

Then, as shown in FIG. 22, the side bands 32, 33 of the leadframe 31 are displaced relative to each other in such a manner that the respective tips 36a–38a of the second to fourth leads 36–38 come into contact with the solder paste deposits 41–43 at the electrode bumps 40a–40c. Relative displacement of the side bands 2, 3 may be preferably performed by a differential overlapping mechanism which is substantially identical to the one shown in FIGS. 10 through 13.

Figure 23:
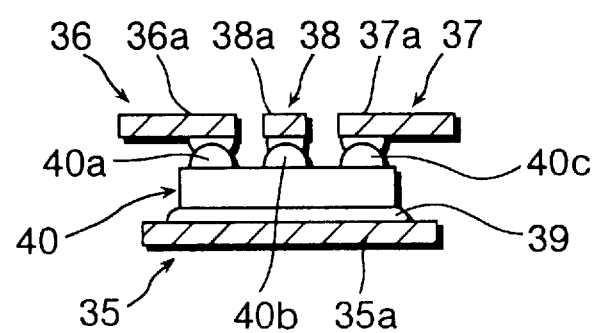
FIG. 23 is a sectional view taken along lines XXIII—XXIII in FIG. 22.

Then, the leadframe 1 is brought into a heating furnace (not shown) for heating to a temperature above the melting point of the applied solder. As a result, the solder layer 39 between the island 35a and the semiconductor chip 40 melts to partially alloy with the island 35a and the chip 40 for bonding thereto. Similarly, each of the solder deposits 41–43 melts to partially alloy with a corresponding one of the electrode bumps 40a–40c and a corresponding one of the second to fourth lead tips 36a–38a. Such a bonded condition is shown in FIG. 23.

Then, a resin package (not shown) is molded to enclose the semiconductor chip 40 together with part of the first to fourth leads 35–38. The package may be typically made of a thermosetting resin such as epoxy.

Finally, the first to fourth leads 35–38 are cut off from the leadframe 31 to provide a product four-terminal semiconductor device.

Figure 24:
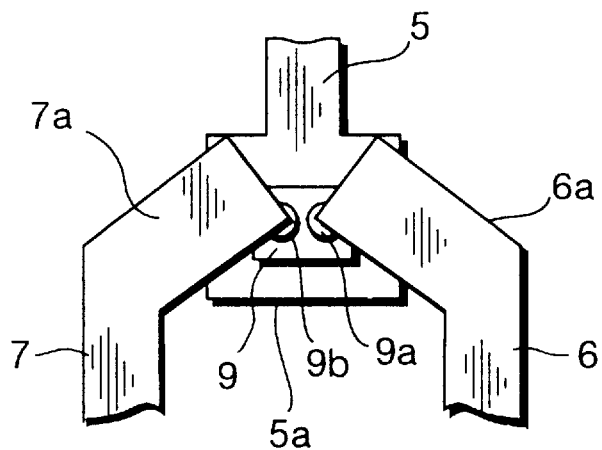
FIG. 24 is a fragmentary plan view showing a principal portion of a semiconductor device according to a eighth embodiment of the present invention.

FIG. 24 shows an eighth embodiment of the present invention which is similar to the first embodiment of FIGS. 1 through 9 but differs therefrom only in that the second and third leads 6, 7 have respective oblique tip portions 6a, 7a extending in a flaring fashion from the respective electrode bumps 9a, 9b.

Figure 25:
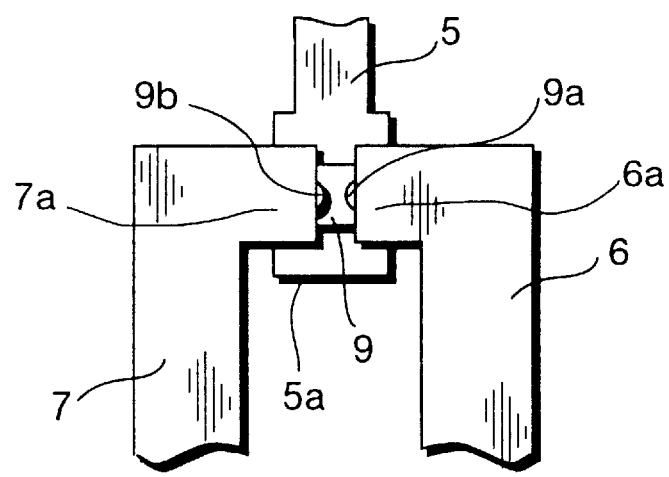
FIG. 25 is a fragmentary plan view showing a principal portion of a semiconductor device according to a ninth embodiment of the present invention.

FIG. 25 shows a ninth embodiment of the present invention which is similar to the first embodiment of FIGS. 1 through 9 but differs therefrom only in that each of the second and third leads 6, 7 are L-shaped and has no inclined portion.

Figure 26:
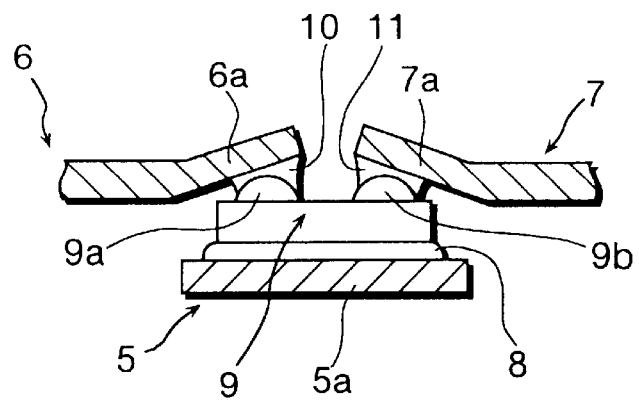
FIG. 26 is a fragmentary sectional view showing a semiconductor device according to a tenth embodiment of the present invention.

FIG. 26 shows a tenth embodiment of the present invention which is similar to the first embodiment of FIGS. 1 through 9 but differs therefrom only in that the tips 6a, 7a of the second and third leads 6, 7 are inclined upwardly toward each other. According to this arrangement, the semiconductor chip 9 floating on the solder layer 8 (temporarily melted by heating) is preventing from displacing longitudinally of the chip 9 (namely, longitudinally of the leadframe) because of contact between the bumps 9a, 9b and the upwardly inclined lead tips 6a, 7a.

Figure 27:
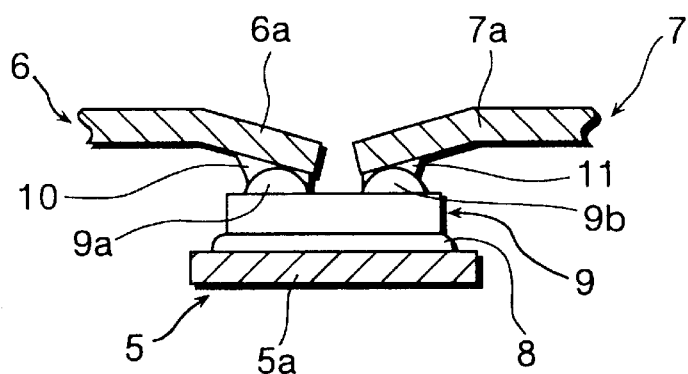
FIG. 27 is a sectional view similar to Fig, 26 but showing a semiconductor device according to an eleventh embodiment of the present invention.

FIG. 27 shows an eleventh embodiment of the present invention which is similar to the tenth embodiment of FIG. 26 but differs therefrom only in that the tips 6a, 7a of the second and third leads 6, 7 are inclined downwardly toward each other. Apparently, this embodiment provides the same advantage as the tenth embodiment.

Figure 28:
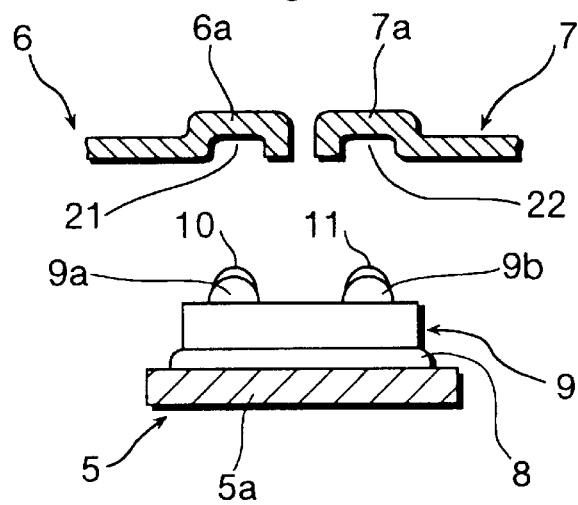
FIG. 28 is a sectional view similar to FIG. 26 but showing a semiconductor device according to a twelfth embodiment of the present invention.

FIG. 28 shows a twelfth embodiment of the present invention which is similar to the first embodiment of FIGS. 1 through 9 but differs therefrom only in that the tips 6a, 7a of the second and third leads 6, 7 are provided with respective recesses which are downwardly open. According to this arrangement, since the recesses 21, 22 directly receives the respective bumps 9a, 9b together with the solder deposits 10, 11, the semiconductor chip 9 floating on the solder layer 8 (temporarily melted by heating) is effectively preventing from displacing longitudinally and transversely of the chip 9.

Figure 29:
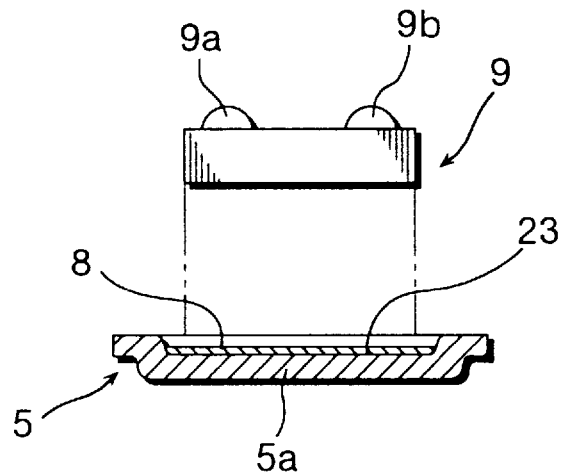
FIG. 29 is a sectional view showing a semiconductor device according to a thirteenth embodiment of the present invention.

FIG. 29 shows a thirteenth embodiment of the present invention wherein the first lead 5 has an island 5a which is provided with a mounting recess 23 for receiving the semiconductor device 9 together with the solder paste layer 8, whereby the recess 23 prevents the chip 9 from positionally deviating. This embodiment is otherwise similar to the first embodiment (FIGS. 1 through 9).

Figure 30:
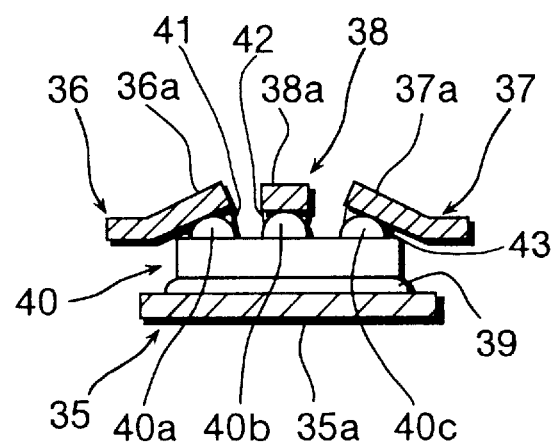
FIG. 30 is a sectional view similar to FIG. 26 but showing a semiconductor device according to a fourteenth embodiment of the present invention.

FIG. 30 shows a fourteenth embodiment of the present invention which is similar to the seventh embodiment of FIGS. 20 through 23 but differs therefrom only in that the tips 36a, 37a of the second and third leads 36, 37 are inclined upwardly toward each other. This embodiment enjoys substantially the same advantage as the tenth embodiment shown in FIG. 26.

Figure 31:
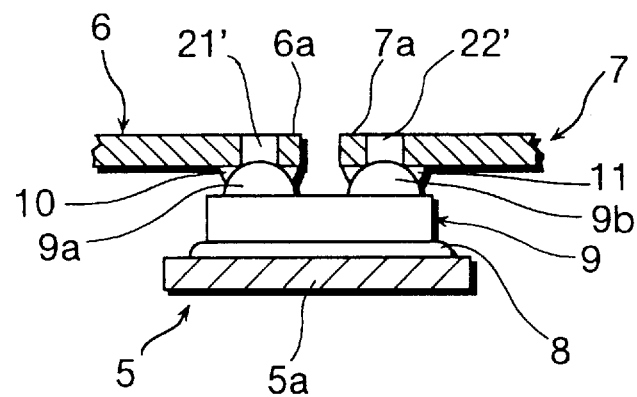
FIG. 31 is a sectional view similar to FIG. 26 but showing a semiconductor device according to a fifteenth embodiment of the present invention.

FIG. 31 shows a fifteenth embodiment of the present invention which is similar to the twelfth embodiment of FIG. 28 but differs therefrom only in that the tips 6a, 7a of the second and third leads 6, 7 are provided with respective openings 21', 22' for receiving the respective electrode bumps 9a, 9b together with the respective solder deposits 10, 11 to prevent the semiconductor chip 9 from displacing longitudinally and transversely.

Figure 32:
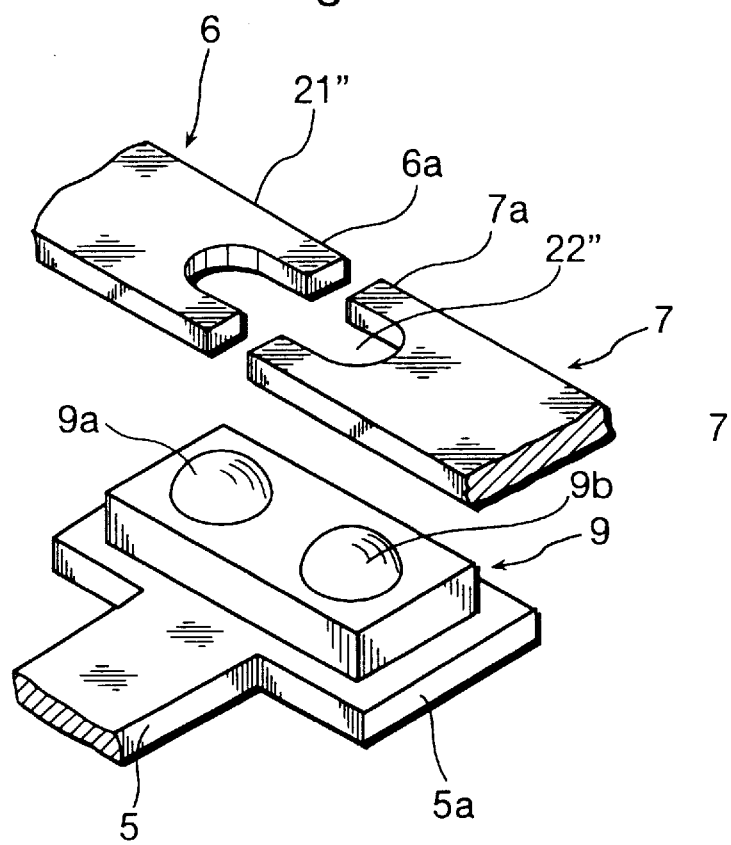
FIG. 32 is a perspective view showing a principal portion of a semiconductor device according to a sixteenth embodiment of the present invention.

FIG. 32 shows a sixteenth embodiment of the present invention which is again similar to the twelfth embodiment of FIG. 28 but differs therefrom only in that the tips 6a, 7a of the second and third leads 6, 7 are provided with respective cutouts 21", 22" in place of the recesses 21, 22 to prevent the semiconductor chip 9 from displacing longitudinally and transversely.

Figure 33:
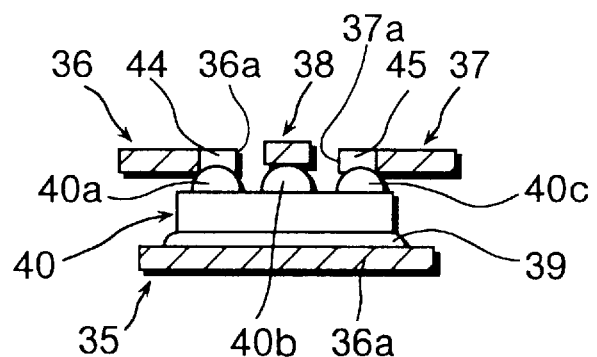
FIG. 33 is a sectional view similar to FIG. 26 but showing a semiconductor device according to a seventeenth embodiment of the present invention.

FIG. 33 shows a seventeenth embodiment of the present invention which corresponds to the combination of the seventh embodiment (FIGS. 20 through 23) and the sixteenth embodiment. Specifically, the second and third leads 36, 37 of the four leads 35–38 have their tips 36a, 37a formed with respective cutouts 44, 45 for receiving the corresponding electrode bumps 40a, 40c together with the corresponding solder deposits (not shown for convenience of illustration).

Figure 34:
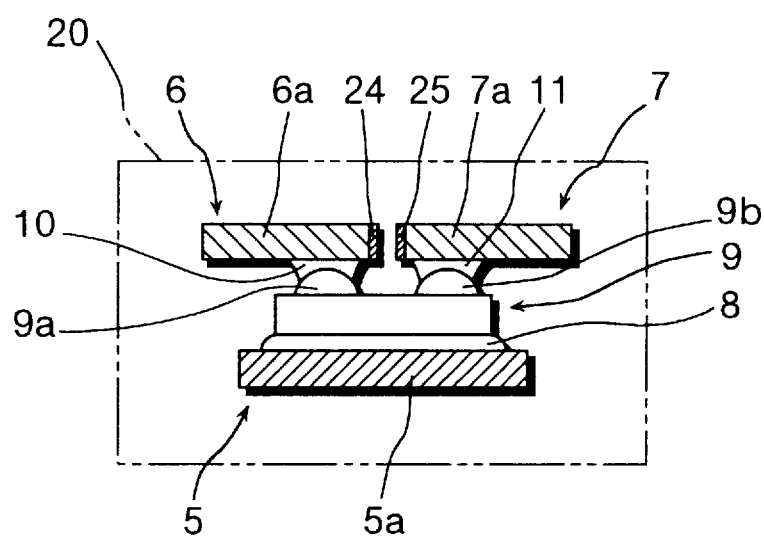
FIG. 34 is a sectional view similar to FIG. 26 but showing a semiconductor device according to a eighteenth embodiment of the present invention.

FIG. 34 shows an eighteenth embodiment of the present invention which is similar to the first embodiment of FIGS. 1 through 9 but differs therefrom only in that the tips 6a, 7a of the second and third leads 6, 7 are provided with an opposite pair of non-soldable members 24, 25. These non-soldable members 24, 25 may be made of a heat-resistant synthetic resin or aluminum plating. As a result, the solder deposits 10, 11 are prevented from merging with each other in a bridging manner when later heated for melting the solder deposits 10, 11.

Figure 35:
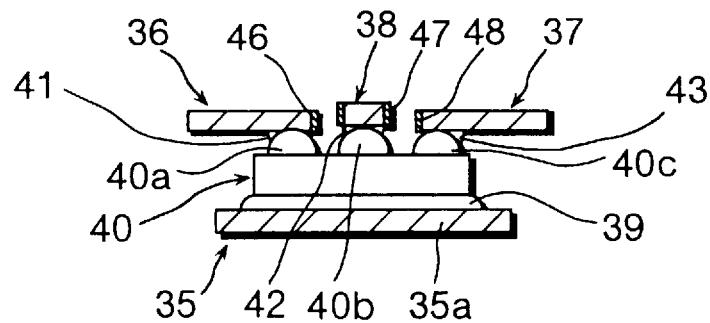
FIG. 35 is a sectional view similar to FIG. 26 but showing a semiconductor device according to a nineteenth embodiment of the present invention.

FIG. 35 shows a nineteenth embodiment of the present invention which corresponds to the combination of the seventh embodiment (FIGS. 20 through 23) and the eighteenth embodiment. Specifically, the tips of the second to fourth leads 36–38 of the four leads 35–38 are provided with two opposite pair of non-soldable members 46–48 which may be made of a heat-resistant synthetic resin or aluminum plating. As a result, the solder deposits 41–43 are prevented from merging with each other in a bridging manner when later heated for melting the solder deposits 41–43.

Figure 36:
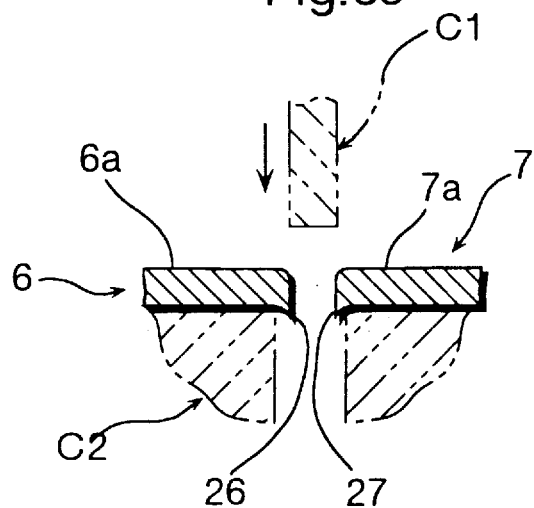
FIG. 36 is a sectional view illustrating how a leadframe is prepared by punching.
Figure 37:
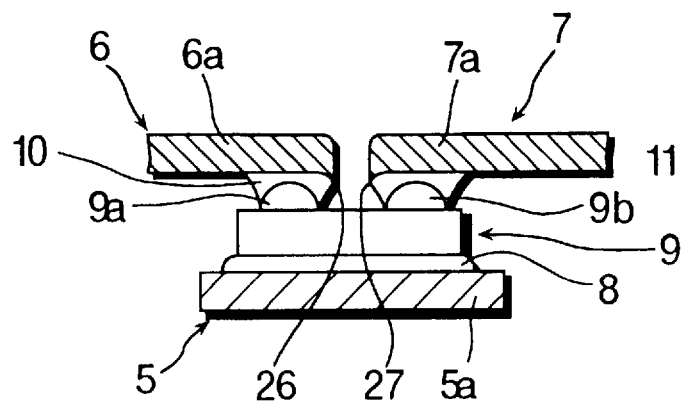
FIG. 37 is a sectional view similar to FIG. 26 but showing a semiconductor device according to a twentieth embodiment of the present invention.

FIGS. 36 and 37 show a twentieth embodiment of the present invention wherein cutting burrs 26, 27 remaining at the respective tips 6a, 7a of the second and third leads 6, 7 are utilized for preventing the solder deposits 10, 11 from merging with each other when the solder deposits 10, 11 are later melted for bonding. The cutting burrs 26, 27 are formed as a result of punching a metal sheet by using punching dies C1, C2, as shown in FIG. 36.

Figure 38:
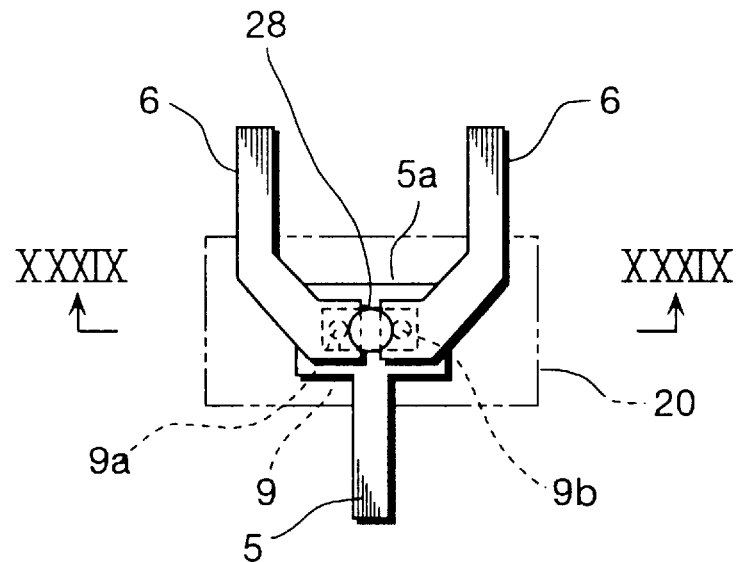
FIG. 38 is a plan view showing a semiconductor device according to a twenty-first embodiment.
Figure 39:
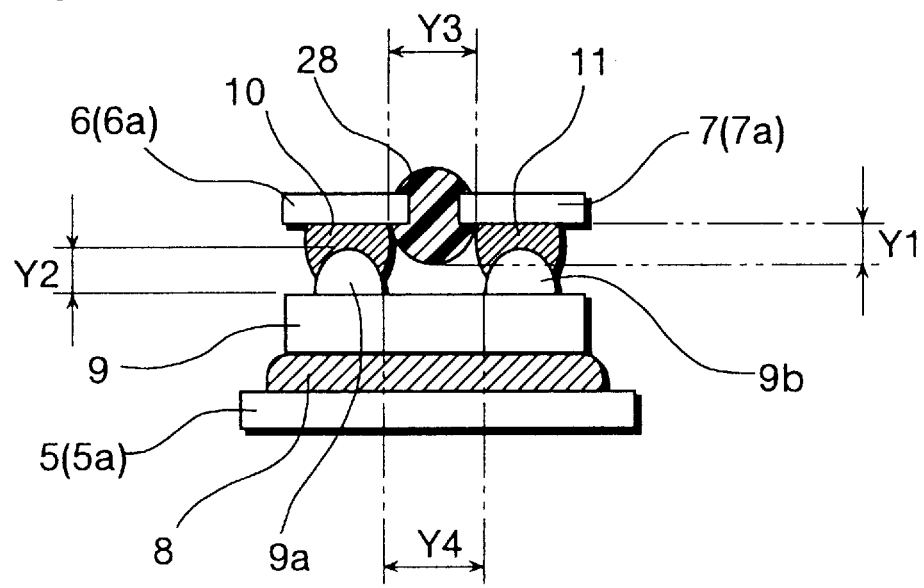
FIG. 39 is a sectional view taken along lines XXXIX—XXXIX in FIG. 38.

FIGS. 38 and 39 show a twenty-first embodiment of the present invention which is similar to the first embodiment of FIGS. 1 through 9 but differs therefrom only in that a non-soldable insulating member 28 is interposed between the tips 6a, 7a of the second and third leads 6, 7. Typically, the insulating member 28 may be made of a heat-resistant synthetic resin such as epoxy. Such a resin material in a fluid state can be deposited in situ under air pressure by a syringe (not shown) having a discharge needle. Due to the provision of the non-soldable insulating member 28, the solder deposits 10, 11 are prevented from merging with each other in a bridging manner when later heated for melting the solder deposits 10, 11. Further, the insulating member 28 directly insulates between the second and third leads 6, 7.

Referring to FIG. 39, the insulating member 28 may have a downward projecting dimension Y1 (about 30 micrometers) which is smaller than the height Y2 (about 60 micrometers), whereas the upward projecting dimension of the insulating member 28 may be about 10 micrometers. Further, the insulating member 28 may have a width Y3 (about 60 micrometers) which is smaller than the interval Y4 (about 80 micrometers) between the two electrode bumps 9a, 9b.

Figure 40:
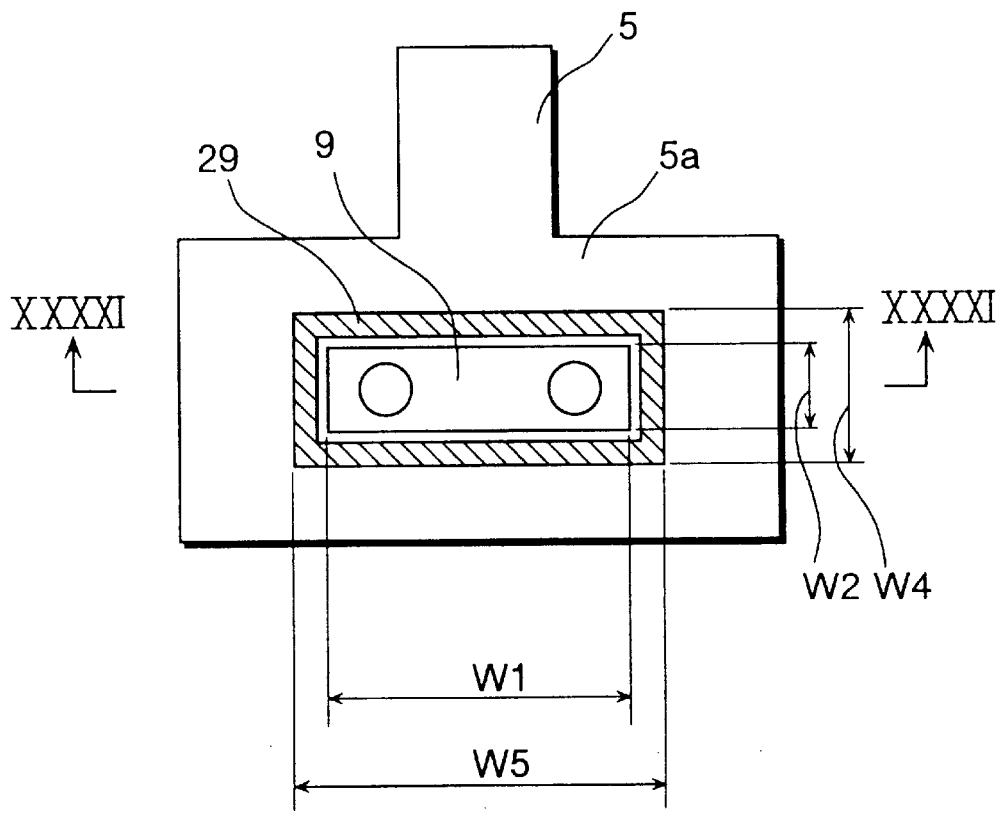
FIG. 40 is a plan view showing a semiconductor device according to a twenty-second embodiment.
Figure 41:
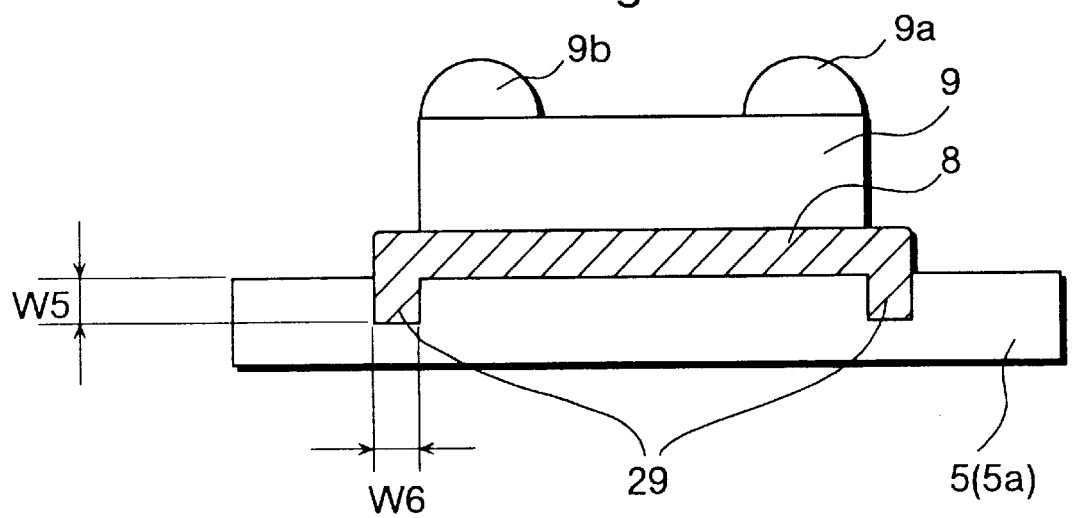
FIG. 41 is a sectional view taken along lines XXXXI—XXXXI in FIG. 40.

FIGS. 40 and 41 show a twenty-second embodiment of the present invention which is similar to the first embodiment of FIGS. 1 through 9 but differs therefrom only in that the island 5a of the first lead 5 is formed with a rectangularly-contoured groove 29 closely surrounding the semiconductor chip 9. According to this embodiment, when the solder layer 8 used for mounting the chip 9 is melted by subsequent heating, the fluidized solder flows into the groove 29 but is prevented from extending or flowing further. As a result, the chip 9 floating on the solder layer 8 is unlikely to deviate from its proper position on the island 5a.

In the twenty-second embodiment shown in FIGS. 40 and 41, the chip 9 may have a length W1 of about 0.6 mm and a width W2 of about 0.4 mm, whereas the rectangle defined by the groove 29 may have a length W3 of about 0.7 mm and a width W4 of about 0.5 mm. Further, the groove 29 may have a depth W5 of 0.05 mm and a width W6 of about 0.05 mm.

The preferred embodiments of the present invention being thus described, it is obvious that the same may be varied in many ways. For instance, the specific number of leads to be incorporated in a semiconductor device is not limited to three or four but may be not less than five. Further, the present invention is applicable not only to transistors but also to various types of semiconductor devices (including special diodes) which incorporates three or more leads j. Such variations are not to be regarded as a departure from the spirit and scope of the present invention, and all such modifications as would be obvious to those skilled in the art-are intended to be included within the scope of the following claims.

We claim:

1. A semiconductor device comprising:
   a first lead having a tip formed with an island;
   a semiconductor chip unit mounted on the island of the first lead by means of a solder layer, the chip unit including at least one semiconductor chip and having a plurality of electrode bumps projecting away from the island; and
   a plurality of additional leads each of which has a tip electrically connected to the electrode bumps via respective solder deposits, the additional leads including at least second and third leads;
   wherein the tips of the second and third leads are at least partially wider than the semiconductor chip; and
   wherein the spacing between the electrode bumps is no less than 0.04 mm.

2. The semiconductor device according to claim 1, wherein the tips of the second and third leads are bent toward the electrode bumps.

3. The semiconductor device according to claim 1, wherein each of the solder deposits for the second and third leads is formed on a corresponding one of the electrode bumps with an outward offset.

4. The semiconductor device according to claim 1, wherein the semiconductor chip unit comprises a plurality of semiconductor chips each having a single electrode bump.

5. The semiconductor device according to claim 1, wherein the additional leads further include a fourth lead between the second and third leads.

6. The semiconductor device according to claim 1, wherein the tips of the second and third leads extend toward each other.

7. The semiconductor device according to claim 1, wherein the tips of the second and third leads extend perpendicularly to the first lead.

8. The semiconductor device according to claim 7, wherein the tips of the second and third leads are followed by respective oblique portions.

9. The semiconductor device according to claim 1, wherein the tips of the second and third leads extend obliquely toward each other in a plane parallel to the island.

10. The semiconductor device according to claim 1, wherein the tips of the second and third leads are inclined in a plane perpendicular to the island.

11. The semiconductor device according to claim 1, wherein each of the tips of the second and third leads is formed with a recess for engaging a corresponding one of the bumps.

12. The semiconductor device according to claim 1, wherein each of the tips of the second and third leads is formed with an opening for engaging a corresponding one of the bumps.

13. The semiconductor device according to claim 1, wherein each of the tips of the second and third leads is formed with a cutout for engaging a corresponding one of the bumps.

14. The semiconductor device according to claim 1, wherein the island is formed with a mounting recess for receiving the semiconductor chip together with the solder layer.

15. The semiconductor device according to claim 1, wherein each of the tips of the second and third leads is formed with a non-soldable member for preventing the solder deposits from merging with each other.

16. The semiconductor device according to claim 1, wherein each of the tips of the second and third leads is formed with a cutting burr for preventing the solder deposits from merging with each other.

17. The semiconductor device according to claim 1, wherein an insulating non-soldable member is interposed between the tips of the second and third leads for preventing the solder deposits from merging with each other while electrically separating between the second and third leads.

18. The semiconductor device according to claim 1, wherein the island is formed with a groove closely surrounding the semiconductor chip, the solder layer entering into the groove.

19. The semiconductor device according to claim 1, wherein the spacing between the electrode bumps is no less than 0.1 mm.

20. The semiconductor device according to claim 1, wherein the spacing between the second and third leads is no less than 0.05 mm.

21. A leadframe comprising:
   a first side band formed with a plurality of first leads arranged at a predetermined pitch longitudinally of the leadframe, each of the first leads having an island;
   a second side band formed with plural groups of additional leads arranged in corresponding relation to the-first leads, each group of additional leads providing a center line which deviates from a corresponding first lead longitudinally of the leadframe by a first dimension; and a plurality of section bars each having a first connecting portion for connection to the first side band and a second connecting portion for connection to the second side band;

wherein the first and second connecting portions of each section bar deviates from each other longitudinally of the leadframe by a second dimension which is substantially half the first dimension.

22. The semiconductor device according to claim 1, wherein the spacing between the electrode bumps is no less than 0.14 mm.

23. The semiconductor device according to claim 1, wherein the spacing between the second and third leads is no less than 0.08 mm.

24. The semiconductor device according to claim 1, wherein the spacing between the second and third leads is no less than 0.1 mm.

25. A semiconductor device comprising:

a first lead having a tip formed with an island;

a semiconductor chip unit mounted on the island of the first lead by means of a solder layer, the chip unit including at least one semiconductor chip and having a plurality of electrode bumps projecting away from the island; and a plurality of additional leads each of which has a tip electrically connected to the electrode bumps via respective solder deposits, the additional leads including at least second and third leads;

wherein the tips of the second and third leads are at least partially wider than the semiconductor chip; and wherein the spacing between the second and third leads is no less than 0.05 mm.

26. The semiconductor device according to claim 25, wherein the spacing between the second and third leads is no less than 0.08 mm.

27. The semiconductor device according to claim 25, wherein the spacing between the second and third leads is no less than 0.1 mm.

28. A semiconductor device comprising:

a first lead having a tip formed with an island;

a semiconductor chip unit mounted on the island of the first lead by means of a solder layer, the chip unit including at least one semiconductor ship and having a plurality of electrode bumps projecting away from the island; and a plurality of additional leads each of which has a tip electrically connected to the electrode bumps via respective solder deposits, the additional leads including at least second and third leads;

wherein the tips of the second and third leads are at least partially wider than the semiconductor chip; and wherein each of the tips of the second and third leads is formed with a non-solderable member for preventing the solder deposits from merging with each other.

29. A semiconductor device comprising:

a first lead having a tip formed with an island;

a semiconductor chip unit mounted on the island of the first lead by means of a solder layer, the chip unit including at least one semiconductor chip and having a plurality of electrode bumps projecting away from the island; and a plurality of additional leads each of which has a tip electrically connected to the electrode bumps via respective solder deposits, the additional leads including at least second and third leads;

wherein the tips of the second and third leads are at least partially wider than the semiconductor chip; and wherein each of the tips of the second and third leads is formed with a cutting burr for preventing the solder deposits from merging with each other.

30. A semiconductor device comprising:

a first lead having a tip formed with an island;

a semiconductor chip unit mounted on the island of the first lead by means of a solder layer, the chip unit including at least one semiconductor ship and having a plurality of electrode bumps projecting away from the island; and a plurality of additional leads each of which has a tip electrically connected to the electrode bumps via respective solder deposits, the additional leads including at least second and third leads;

wherein the tips of the second and third leads are at least partially wider than the semiconductor chip; and wherein an insulating non-solderable member is interposed between the tips of the second and third leads for preventing the solder deposits from merging with each other while electrically separating between the second and third leads.

* * * * *